(12) United States Patent
Peschke et al.

(10) Patent No.: US 10,649,008 B2
(45) Date of Patent: May 12, 2020

(54) SIGNAL CORRECTION METHOD, SYSTEM FOR CORRECTING A MEASURED SIGNAL, AS WELL AS OSCILLOSCOPE

(71) Applicant: Rohde & Schwarz GmbH & Co. KG, Munich (DE)

(72) Inventors: Martin Peschke, Vaterstetten (DE); Andreas Ziegler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 78 days.

(21) Appl. No.: 15/964,283

(22) Filed: Apr. 27, 2018

(65) Prior Publication Data

US 2018/0313872 A1     Nov. 1, 2018

(30) Foreign Application Priority Data

Apr. 27, 2017    (EP) ..................................... 17168475

(51) Int. Cl.
| | |
|---|---|
| *G01R 13/02* | (2006.01) |
| *G01R 35/00* | (2006.01) |
| G01R 31/317 | (2006.01) |

(52) U.S. Cl.
CPC ........... *G01R 13/02* (2013.01); *G01R 35/005* (2013.01); *G01R 35/007* (2013.01); *G01R 31/31706* (2013.01)

(58) Field of Classification Search
CPC .................. G01R 13/02; G01R 35/007; G01R 31/31706; G01R 35/005; H04L 27/265; H04L 27/3863
USPC ............. 324/637–661, 500, 600, 601, 76.11, 324/76.26, 444, 447, 515, 559
See application file for complete search history.

(56) References Cited

U.S. PATENT DOCUMENTS

| | | | |
|---|---|---|---|
| 9,484,942 B1* | 11/2016 | Peschke | ............ G01R 13/0254 |
| 2007/0002964 A1 | 1/2007 | Xu | |
| 2013/0003799 A1* | 1/2013 | Baney | .................... H04B 17/11 |
| | | | 375/224 |
| 2013/0003804 A1 | 1/2013 | Baney | |

OTHER PUBLICATIONS

Dabóczi, T., "Nonparametric Identification Assuming Two Noise Sources: A Deconvolution Approach," IEEE Transactions on Instrumentation and Measurement, 47(4):828-832, Aug. 1998.
Shize, G., et al, "The Dynamic Calibration of Digital Storage Oscilloscopes in Noise Environments," Conference Proceedings, 1994 IEEE Instrumentation and Measurement Technology Conference, May 10, 1994, 3 pages.
Sui, C., et al, "New Methods to Characterize Deterministic Jitter and Crosstalk-Induced Jitter from Measurements," IEEE Transactions on Electromagnetic Compatibility, 57(4):877-884, Mar. 24, 2015.

\* cited by examiner

*Primary Examiner* — Melissa J Koval
*Assistant Examiner* — Trung Nguyen
(74) *Attorney, Agent, or Firm* — Christensen O'Connor Johnson Kindness PLLC

(57) ABSTRACT

A signal correction method for correcting a measured signal has the following steps: processing a digital representation of a first signal at a first measurement input; processing a digital representation of a second signal at a second measurement input corresponding to the first signal convoluted with a transfer function; and determining the transfer function for correcting the measured signal. Further, a use of the method, a system for correcting a measured signal, and an oscilloscope are provided.

13 Claims, 3 Drawing Sheets

SIGNAL CORRECTION METHOD, SYSTEM FOR CORRECTING A MEASURED SIGNAL, AS WELL AS OSCILLOSCOPE

FIELD OF THE DISCLOSURE

The disclosure relates to a signal correction method for correcting a measured signal, a system for correcting a measured signal as well as an oscilloscope.

BACKGROUND

When measuring signals, interferences, such as crosstalk and noise, are influencing and disturbing the signal to be measured. This leads to a loss of quality of the measurement.

FIG. 1 shows a prior art example of a measurement setup. A device under test comprises two transistors 2, 4. The gate-source voltage of the first transistor 2 shall be measured using a differential probe 6 connected to the gate and the source of the first transistor 2.

However, a large, periodic voltage across the second transistor 4 interferes with the measurement because real differential probes cannot completely compensate fast changing voltages with large amplitudes.

Thus, the signal M measured by the differential probe 6 comprises the signal to be measured S and the signal causing interference I convoluted with a transfer function H as illustrated in FIG. 1.

The transfer function H represents the coupling between the signal to be measured S or the signal line carrying the signal to be measured S and the signal causing interference I. This disturbed signal is measured at a measuring device 8, for instance an oscilloscope, being connected to the probe 6. Besides the shown example, interference can also arise from signal lines running very close to each other and other known causes.

As the interference deteriorates the measurement quality, attempts are made to reduce the interference completely.

It is known in the prior art to provide a shielding for the measurement line in order to prevent crosstalks or any other coupling between the signal line and a potential source of interference.

However, interference cannot be reduced to zero in this way. Further, the costs increase due to the additional hardware required in order to minimize the occurring interferences.

SUMMARY

A method is provided for correcting a measured signal is provided having the following steps:
processing a digital representation of a first signal at a first measurement input;
processing a digital representation of a second signal at a second measurement input corresponding to the first signal convoluted with a transfer function; and
determining the transfer function for correcting the measured signal.

Thus, it is not attempted to shield the measurement inputs from the signal causing the interference but the signal causing the interference is actually connected to one of the measurement inputs. By doing so, it is possible to determine the way the signal causing interference interferes with the signal to be measured and to determine the corresponding transfer function that can be used for eliminating the interference from the measured signal. In some embodiments, the signal to be measured is corrected by post-processing.

For example, a signal to be measured is applied to the second measurement input yielding a digital representation of a third signal at the second measurement input; a signal causing interference is applied to the first measurement input yielding a digital representation of the signal causing interference; and the digital representation of the third signal is corrected using a convolution of the digital representation of the signal causing interference and the transfer function to obtain the corrected measured signal. This way, the quality of the measurement can be raised significantly by actually measuring the signal causing interference and subtracting its known influence to the measured signal from the measured signal itself in order to mathematically eliminate the influence. This method leads to a very precise measurement of the signal to be measured without any additional hardware as the correction is done in a post-processing step.

For improved compensation of the interference, the first signal may be created by applying the signal causing interference to the first measurement input.

The signal causing interference may be an interfering signal that interferes with the signal to be measured so that a broad variety of causes for interference can be compensated.

For example, the third signal comprises the signal to be measured and interference caused by the signal causing interference. Thus, the signal to be measured can completely be extracted from the third signal. The third signal comprises the measured signal to be corrected at least partly.

In one aspect of the disclosure, the second signal is a portion of the third signal. This way, it is also possible to compensate for interference that is limited in time.

In general, the term "signal" is used to describe a single oscillation or an oscillation limited in time and also long-lasting periodic oscillations.

According to one aspect of the disclosure, the third signal is corrected in real-time, for example by determining the transfer function in real-time allowing for a high quality measurement even under changing conditions.

To improve the measurement quality further, the first measurement input and the second measurement input may be coherent. The measurement results obtained from both measurement inputs can be combined for correction purposes due to the coherence of both measurement inputs. Accordingly, the quality of the correction is improved resulting in an improved measurement quality after applying the dedicated correction step.

For example, the first signal is a periodic signal. Accordingly, it is possible to compensate also periodic interference. In some embodiments, the periodically occurring interferences are compensated easily once the corresponding influence of one period has been determined.

In another aspect of the disclosure, the amplitude of the first signal is at least one order of magnitude larger than the amplitude of the signal to be measured. Thus, high quality measurements are possible even with a very strong interfering signal.

In order to precisely determine the transfer function with high precision, the first signal applied to the first measurement input may be a calibrating signal and the second signal may be a voltage measured using a short-circuited differential probe.

It is further provided a use of the method described above for eliminating common-mode interference of a measured signal. The signal to be measured and/or the signal causing interference may be measured by a differential oscilloscope probe or using two oscilloscope probes.

It is further provided a system for correcting a measured signal, comprising a first measurement input, a second measurement input and a control unit, wherein an analog to digital converter is allocated to each of the measurement inputs and wherein the control unit is configured to perform the method according to the method.

Further, an oscilloscope comprising the system according to the disclosure is provided.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well known process steps have not been described in detail in order not to unnecessarily obscure various aspects of the present disclosure. Further, it will be appreciated that embodiments of the present disclosure may employ any combination of features described herein.

Figure 1:
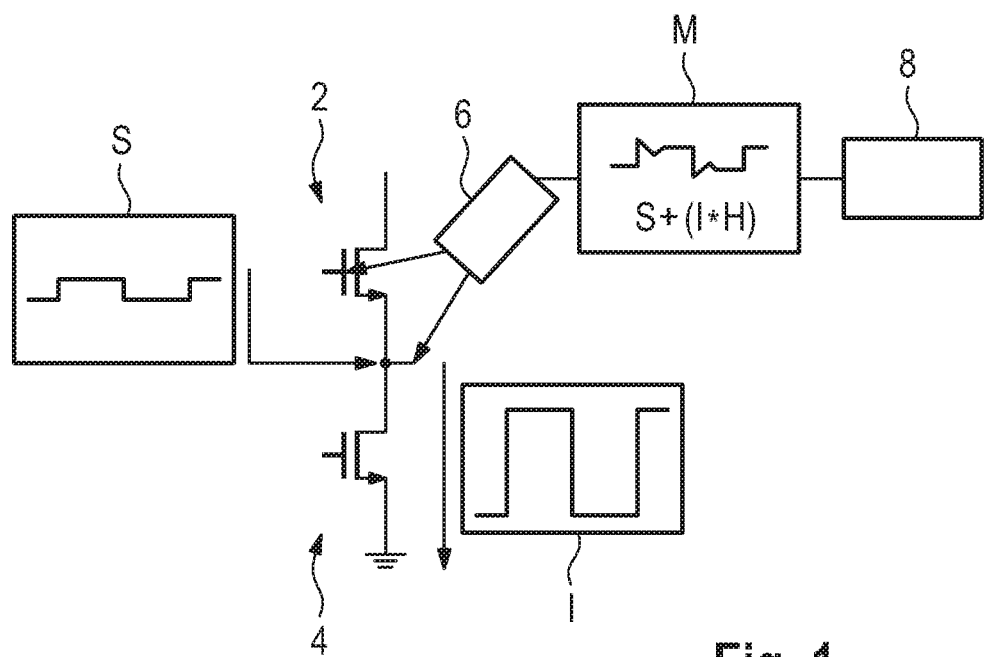
FIG. 1 shows a measurement setup according to the prior art.
Figure 2:
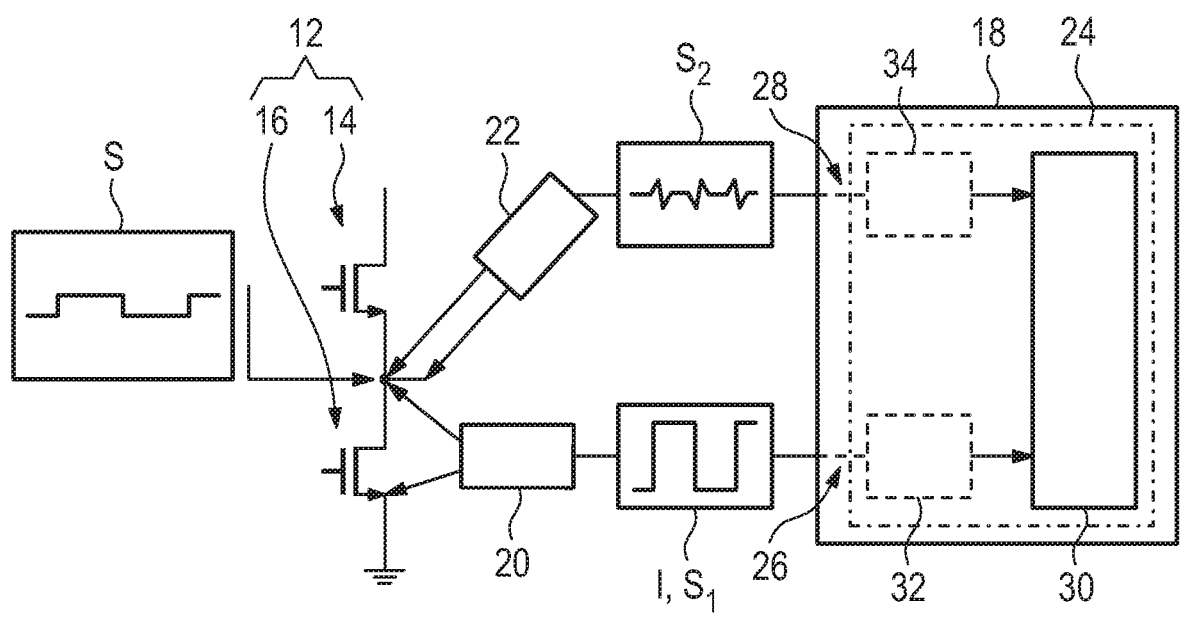
FIG. 2 shows schematically a test setup comprising an oscilloscope according to the disclosure having a system according to the disclosure performing the signal correction method according to the disclosure.

FIG. 2 shows schematically a test setup 10 to measure a voltage on a device under test 12. In the shown example, the device under test 12 comprises two transistors 14, 16, wherein the source of the first transistor 14 is connected to the drain of the second transistor 16. In this example, the voltage between the gate and the source of the first transistor 14 shall be measured, i.e. the signal to be measured S is a periodic voltage signal at the gate of the first transistor 14.

However, another periodic voltage signal, called the signal causing interference I, is present at the source of the second transistor 16. The signal causing interference I has an amplitude of at least one order of magnitude larger than the amplitude of the signal to be measured S.

As shown in FIG. 2, the test setup 10 comprises an oscilloscope 18, a first differential probe 20 and a second differential probe 22. The oscilloscope 18 comprises a system 24 for correcting a measured signal having a first measurement input 26, a second measurement input 28, a control unit 30 and a first and second analog to digital converter 32, 34.

The first analog-to-digital converter 32 is arranged between the first measurement input 26 and the control unit 30. Likewise, the second analog to digital converter 34 is arranged between the second measurement input 28 and the control unit 30. The first measurement input 26 and the second measurement input 28 are coherent in order to have a fixed time wise relation between the signals inputted at the first measurement input 26 and at the second measurement input 28.

The first differential probe 20 is connected to the first measurement input 26 providing a signal to the first measurement input 26. Likewise, the second differential probe 22 is connected to the second measurement input 28 providing a signal to the second measurement input 28.

For determining the coupling and thus the interference between the signal causing interference I and the signal to be measured S, the probe heads of the first differential probe 20 are connected to the source of the second transistor 16 and the drain of the second transistor 16 (i.e. the source of the first transistor 14). Thus, the first differential probe 20 provides a first signal $S_1$ to the first measurement input 26 of the system 24 corresponding to the signal causing the interference I. The first signal $S_1$ may be seen as a calibrating signal.

The first analog to digital converter 32 creates a digital representation of the first signal $S_1$ and feeds this digital representation to the control unit 30 for further processing.

The probe heads of the second differential probe 22 are both connected to the source of the first transistor 14, thus the second differential probe 22 is short-circuited in this case.

The second differential probe 22 measures a second signal $S_2$ being a convolution of the interfering signal I with a transfer function H. The second signal $S_2$ is provided to the second measurement input 28 of the system 24 and a digital representation of the second signal $S_2$ is created by the second analog to digital converter 34. The digital representation of the second signal $S_2$ is then fed to the control unit 30 of the system 24 for further processing.

Figure 3:
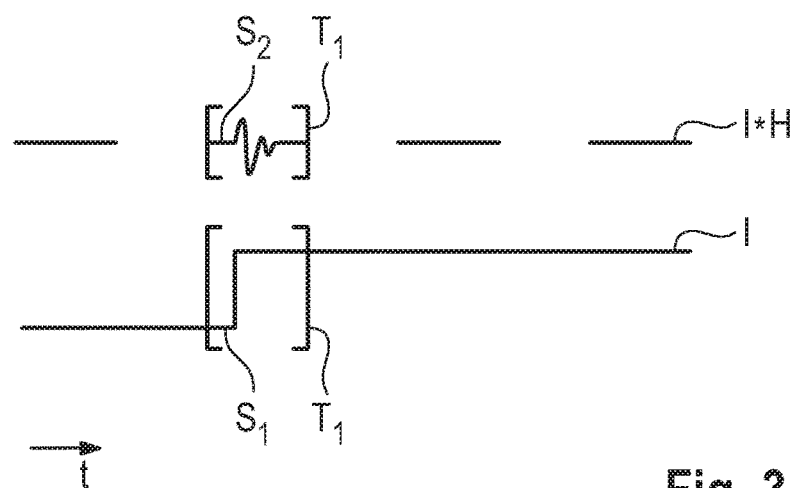
FIG. 3 shows an illustration of the first and the second signal used in the method according to FIG. 2.

The relation between the first signal $S_1$ and the second signal $S_2$ can be seen in FIG. 3, showing the first signal $S_1$ and the second signal $S_2$ over time. For the sake of simplicity, the first signal $S_1$ is illustrated as a step function with a single step in the highlighted time interval $T_1$. Of course, in a periodic signal, the first signal $S_1$ comprises several steps each leading to an interference with the measurement and thus several second signals $S_2$.

In the time interval $T_1$, the sudden change of voltage at the source of the first transistor 14, seen in the first signal $S_1$ as the step up, creates interference in the measurement of the second differential probe 22 that is illustrated as a wiggle of the second signal $S_2$. The second signal $S_2$ is a convolution of the first signal $S_1$ and the transfer function H, simplified $S_2=S_1*H$.

The control unit 30 fed with both signals $S_1$ and $S_2$ is therefore able to determine this transfer function H, using digital representations of the first signal $S_1$ and the second signal $S_2$. The determined transfer function H is stored in a memory of or associated with the control unit 30 for correcting a signal measured by the second differential probe 22 during the actual measurement in order to correct the signal measured appropriately.

Figure 4:
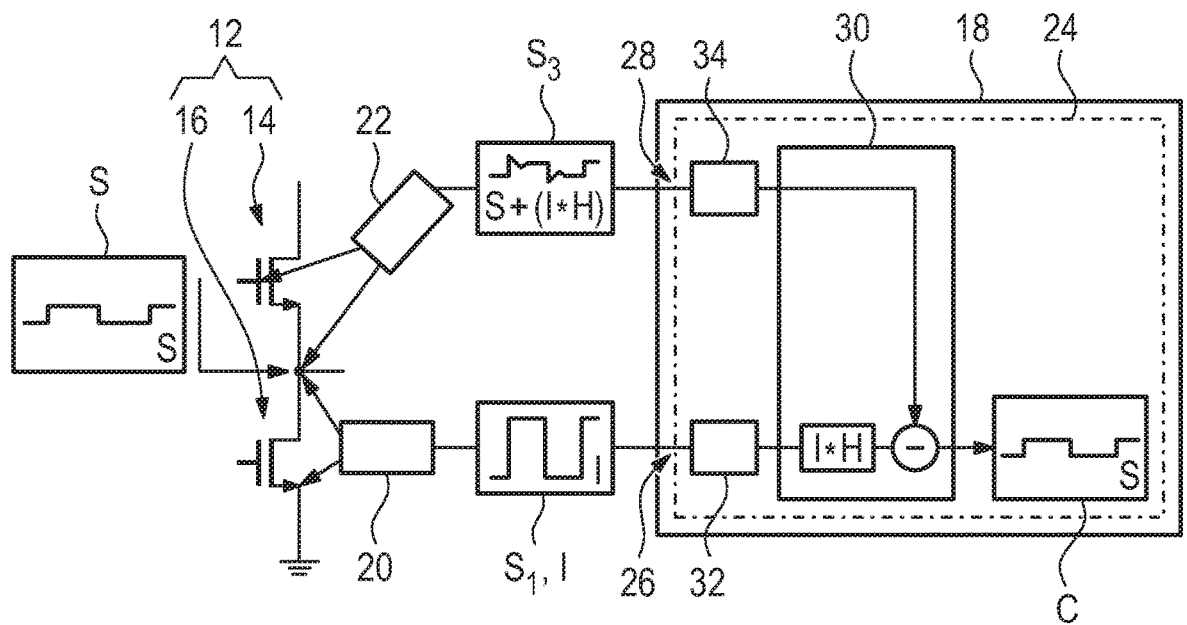
FIG. 4 shows the test setup according to FIG. 2 performing signal correction.

FIG. 4 shows the test setup 10 for actually measuring the signal to be measured S across the gate and the source of the first transistor 14. The wiring of the first differential probe 20 remains as shown in FIG. 2. Thus, the signal causing interference I is still fed to the first measurement input 26. However, the wiring of the second differential probe 22 is changed. The probe heads of the second differential probe 22 are now connected to the gate and the source of the first transistor 14, respectively.

Figure 5A:
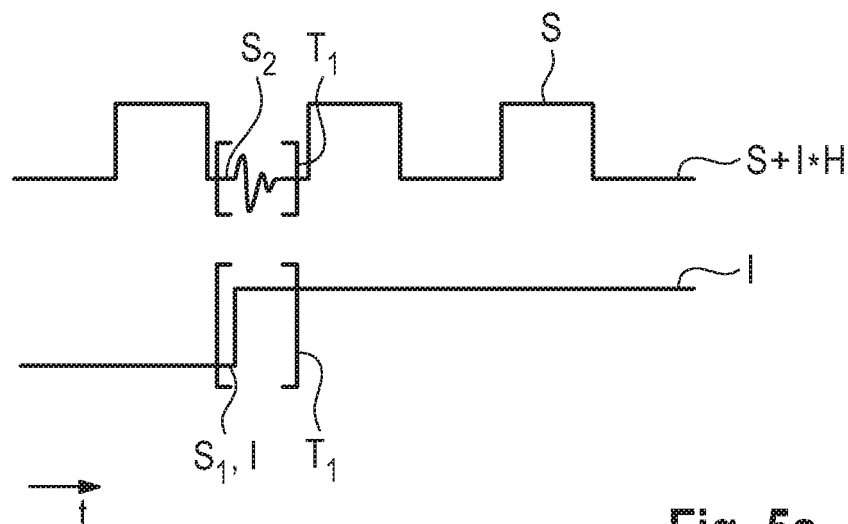
FIG. 5a shows the first, second and third signal used in the method according to FIG. 4.
Figure 5B:
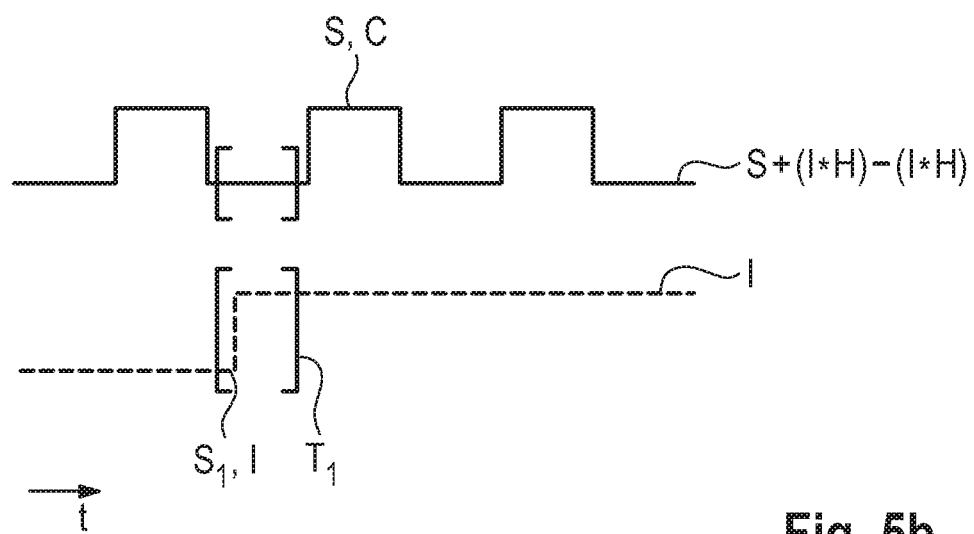
FIG. 5b shows the corrected signal and the first, interfering signal schematically.

Accordingly, the second differential probe 22 measures the signal to be measured S. However, because one of the probe heads of the second differential probe 22 is connected to the source of the first transistor 14, the measurement of the signal to be measured S is still disturbed by the interfering signal I. Thus, the second differential probe 22 measures a third signal $S_3$ comprising the signal to be measured S and the second signal $S_2$, i.e. the interference caused by the signal causing interference I. In other words, the third signal $S_3$ has a portion being the signal to be measured S and a portion corresponding to the second signal $S_2$, as can be seen in FIG. 5a, wherein the second signal $S_2$ is the convolution of the first signal $S_1$ and the transfer function H. Simplified $S_3$ is equal to $S+S_2$.

The third signal $S_3$ is then provided to the second measurement input 28. The signals $S_1$, $S_3$ are again converted by the first and second analog-to-digital converters 32, 34 and fed to the control unit 30. The control unit 30 uses the digital representation of the first signal $S_1$ and the stored transfer function H previously determined in order to determine the convolution of the digital representation of the first signal $S_1$ with the transfer function H. The result of the convolution equals the influence of the signal causing interference I on the measurement of the second differential probe 22, i.e. the result corresponds to the second signal $S_2$.

The result of the convolution is then subtracted from the third signal $S_3$. Accordingly, the second signal $S_2$ present in the third signal $S_3$ is eliminated by the result of the convolution leaving only a digital representation of corrected measured signal C being the signal to be measured S without interference. The corrected measured signal C is then outputted by the control unit 30 for further processing, for example for outputting on a display of the oscilloscope 18. Thus, a high quality measurement of a signal to be measured S can be performed even if interference by a signal causing interference I is present.

The method shown can also be used for eliminating common-mode interference of a measured signal.

In the shown embodiment, the system 24 is part of an oscilloscope 18. However, it is also possible to integrate the system 24 in other measurement devices. Further, even though differential probes 20, 22 are shown for measuring various signals, it is of course possible that single headed probes are used instead of one or both of the differential probes 20, 22.

The described method can also be used in situations where a signal line carrying the signal to be measured is subjected to noise or interference by another source of interference, for example via crosstalk of signal lines. In this case, the first measurement input 26 of the system 24 is connected to the signal line causing the crosstalk and the signal line carrying the signal to be measured S is connected to the second measurement input 28.

Furthermore, it is possible that the first signal $S_1$ applied to the first measurement input 26 is a calibrating signal. The calibrating signal can be known beforehand.

In addition, it is possible to calculate the transfer function H in real-time during a measurement in order to adapt for a change of the magnitude or other characteristics of the interference.

Alternatively, the signal causing interference I is a constant signal being synchronous to the signal to be measured S. Then, a static and constant correction is applied. Further, it is not necessary to occupy the first measurement input 26 during the correction of the signal to be measured S such that the first measurement input 26 can be used for different measurements.

One or more components described above, including the control unit 30, may include, in some embodiments, logic for implementing the technologies and methodologies described herein. This logic of, for example, the control unit 30 can be carried out in either hardware or software, or a combination of hardware and software. For example, in some embodiments, the control unit 30 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, memory or combinations thereof.

In an embodiment, the control unit 30 includes a microprocessor and a memory storing logic modules and/or instructions. In an embodiment, the control unit 30 includes one or more ASICs having a plurality of predefined logic components. In an embodiment, the control unit 30 includes one or more FPGA having a plurality of programmable logic components. In an embodiment, the control unit 30 includes hardware circuit implementations (e.g., implementations in analog circuitry, implementations in digital circuitry, and the like, and combinations thereof). In an embodiment, the control unit 30 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A signal correction method for correcting a measured signal having the following steps:
   processing a digital representation of a first signal at a first measurement input;
   processing a digital representation of a second signal at a second measurement input corresponding to the first signal convoluted with a transfer function;
   determining the transfer function for correcting the measured signal;

applying a signal to be measured to the second measurement input yielding a digital representation of a third signal at the second measurement input;

applying a signal causing interference to the first measurement input yielding a digital representation of the signal causing interference; and correcting the digital representation of the third signal by using a convolution of the digital representation of the signal causing interference and the transfer function to obtain the corrected measured signal.

2. The method according to claim 1, wherein the first signal is created by applying the signal causing interference to the first measurement input.

3. The method according to claim 1, wherein the signal causing interference is an interfering signal that interferes with the signal to be measured.

4. The method according to claim 1, wherein the third signal comprises the signal to be measured and interference caused by the signal causing interference.

5. The method according to claim 1, wherein the second signal is a portion of the third signal.

6. The method according to claim 1, wherein the third signal is corrected in real-time, in particular by determining the transfer function in real-time.

7. The method according to claim 1, wherein the first measurement input and the second measurement input are coherent.

8. The method according to claim 1, wherein first signal is a periodic signal.

9. The method according to claim 1, wherein the amplitude of first signal is at least one order of magnitude larger than the amplitude of the signal to be measured.

10. The method according to claim 1, wherein the first signal applied to the first measurement input is a calibrating signal and that the second signal is a voltage measured using a short-circuited differential probe.

11. The method according to claim 1 used for eliminating common-mode interference of a measured signal.

12. A system for correcting a measured signal, comprising a first measurement input, a second measurement input, a control unit, and an analog to digital converter allocated to each of the measurement inputs, wherein the control unit is configured to:

process a digital representation of a first signal at a first measurement input;

process a digital representation of a second signal at a second measurement input corresponding to the first signal convoluted with a transfer function;

determine the transfer function for correcting the measured signal;

apply a signal to be measured to the second measurement input yielding a digital representation of a third signal at the second measurement input;

apply a signal causing interference to the first measurement input yielding a digital representation of the signal causing interference; and correct the digital representation of the third signal by using a convolution of the digital representation of the signal causing interference and the transfer function to obtain the corrected measured signal.

13. An oscilloscope having a system for correcting a measured signal, comprising a first measurement input, a second measurement input, a control unit, an analog to digital converter allocated to each of the measurement inputs, wherein the control unit is configured to:

process a digital representation of a first signal at a first measurement input;

process a digital representation of a second signal at a second measurement input corresponding to the first signal convoluted with a transfer function;

determine the transfer function for correcting the measured signal;

apply a signal to be measured to the second measurement input yielding a digital representation of a third signal at the second measurement input;

apply a signal causing interference to the first measurement input yielding a digital representation of the signal causing interference; and correct the digital representation of the third signal by using a convolution of the digital representation of the signal causing interference and the transfer function to obtain the corrected measured signal.

* * * * *